United States Patent
Ramakrishnan (10) Patent No.: US 9,016,199 B2
(45) Date of Patent: Apr. 28, 2015

(54) OPTIMIZATION OF UV CURING (71) Applicant: Unipixel Displays, Inc., The Woodlands, TX (US)

(72) Inventor: Ed S. Ramakrishnan, The Woodlands, TX (US)

(73) Assignee: Unipixel Displays, Inc., The Woodlands, TX (US)

( * ) Notice: Subject to any disclaimer, the term of this patent is extended or adjusted under 35 U.S.C. 154(b) by 0 days.

(21) Appl. No.: 13/979,848

(22) PCT Filed: Oct. 25, 2012

(86) PCT No.: PCT/US2012/061809
§ 371 (c)(1),
(2) Date: Jul. 15, 2013

(87) PCT Pub. No.: WO2013/063202
PCT Pub. Date: May 2, 2013

(65) Prior Publication Data
US 2014/0047992 A1    Feb. 20, 2014

Related U.S. Application Data

(60) Provisional application No. 61/551,161, filed on Oct. 25, 2011.

(51) Int. Cl.
G03F 7/00 (2006.01)
B41N 1/06 (2006.01)
G03F 7/20 (2006.01)

(52) U.S. Cl.
CPC .............. *B41N 1/06* (2013.01); *B41M 2205/14* (2013.01); *G03F 7/2014* (2013.01); *G03F 7/2022* (2013.01); *G03F 7/20* (2013.01)

(58) Field of Classification Search
None
See application file for complete search history.

(56) References Cited

U.S. PATENT DOCUMENTS

| 5,215,859 A | 6/1993 | Martens |
| 6,213,018 B1 | 4/2001 | Samworth |
| 2007/0218409 A1 | 9/2007 | McLean et al. |
| 2010/0143840 A1 | 6/2010 | Veres et al. |

OTHER PUBLICATIONS

PCT/US2012/061809 International Search Report and Written Opinion dated Mar. 29, 2013 (9 pgs.).

*Primary Examiner* — Joshua D Zimmerman
(74) *Attorney, Agent, or Firm* — Conley Rose, P.C.

(57) ABSTRACT

A system and method of preparing a flexoplate so it is suitable for the printing of high resolution patterns. The method includes controlling the curing conditions of the flexoplate, thereby controlling the properties of said flexoplate such as floor thickness, pattern cross-sectional geometry, repeatability of printed features during the printing process, and durability of the flexoplate during the printing process.

23 Claims, 9 Drawing Sheets

OPTIMIZATION OF UV CURING

CROSS-REFERENCE TO RELATED APPLICATION

This application is a national stage of and claims priority under 35 U.S.C. 371 to International Patent Application Serial No. PCT/US2012/061809, filed on Oct. 25, 2012, entitled "OPTIMIZATION OF UV CURING" by Ed. S. RAIVIAKRISHNAN, which claims the benefit of and priority under 35 U.S.C. §119 to U.S. Provisional Patent Application No. 61/551,161, filed on Oct. 25, 2011, entitled "OPTIMIZATION OF UV CURING" by Ed. S. RAIVIAKRISHNAN, both of which are hereby incorporated herein by reference in their entirety for all purposes.

BACKGROUND

Flexographic printing may be used to print a variety of substrates including glass, paper, and polymers. The flexographic printing process may be used on its own or as part of an in-line process, for example, a roll-to-roll handling process. The patterned flexoblanks used during a flexographic printing process may be designed for long term use, dedicated use, or as disposable, short term use.

SUMMARY

In an embodiment, a method for patterning a flexoblank comprising: disposing a mask on the second surface of a flexoblank, wherein the flexoblank comprises a first surface and a second surface opposite the first surface, wherein the first surface comprises a backing; and curing the first surface, wherein curing the first surface forms a floor on the first surface, and wherein curing comprises emitting ultraviolet (UV) radiation with a plurality of wavelengths between 250 nm-600 nm and a curing dosage from 0.3 J/cm$^2$ to 1.0 J/cm$^2$. The embodiment further comprising curing the second surface to form a pattern on the second surface, wherein curing the second surface comprises UV light at a dosage between 5 J/cm2 and 25 J/cm2; wherein forming the pattern comprises forming a plurality of lines, wherein the cross-section of each of the plurality of lines is one of a square, a rectangle, a triangle, and a trapezoid, wherein a plurality of valleys are formed in between each set of lines of the plurality of lines, and wherein the valley depth is between 5-20 microns.

In an alternate embodiment, a method for patterning a flexoblank comprising: disposing a mask on the second surface of a flexoblank, wherein the flexoblank comprises a first surface and a second surface opposite the first surface, wherein the first surface comprises a backing; and curing the first surface, wherein curing the first surface forms a floor on the first surface and wherein curing comprises emitting ultraviolet (UV) radiation with a plurality of wavelengths between 250 nm-600 nm and a curing dosage from 0.3 J/cm$^2$ to 1.0 J/cm$^2$. The embodiment further comprising curing the second surface to form a pattern on the second surface comprising UV light at a dosage between 5 J/cm$^2$ and 25 J/cm$^2$; and wherein the pattern comprises a plurality of lines, and wherein a sidewall angle of the plurality of lines is between 20°-70°.

In an alternate embodiment, a method of forming a high-resolution conductive pattern comprising: patterning a flexoblank comprising a first and a second surface, wherein patterning comprises: disposing a mask on a second surface of the flexoblank; curing a first surface using ultraviolet light with a plurality of wavelengths between 250 nm-600 nm and a curing dosage between 0.3 J/cm$^2$ to 1.0 J/cm$^2$, wherein curing the first surface forms a floor on the first surface, curing the second surface curing the second surface to form a pattern on the second surface comprising UV light at a dosage between 5 J/cm$^2$ and 25 J/cm$^2$; and forming, subsequent to curing the second surface, a pattern on the second surface, wherein the pattern comprises a plurality of lines with sidewall angles between 20°-70°. The embodiment further comprising disposing the patterned flexoblank on a roller; printing a first substrate using a first ink and the patterned flexoplate on at least one side of the substrate; printing a second substrate on at least one side; plating the substrate, wherein plating the substrate comprises plating the substrate with a conductive material; and forming, subsequent to plating, a high-resolution conductive pattern.

In an embodiment, a method for patterning a flexoblank comprising: disposing a first mask on a first surface of a flexoblank, wherein the flexoblank comprises a first surface and a second surface opposite the first surface, wherein the first surface comprises a backing and curing the first surface, wherein curing the first surface forms a floor on the first surface and wherein curing comprises emitting ultraviolet (UV) radiation with a plurality of wavelengths between 250 nm-600 nm and a curing dosage from 0.3 J/cm$^2$ to 1.0 J/cm$^2$. The embodiment further comprising curing the second surface to form a printing pattern and a base support structure on the second surface using a first mask comprising UV light at a dosage between 5 J/cm$^2$ and 25 J/cm$^2$; wherein the printing pattern comprises a first plurality of lines, and wherein the first mask is between 10-1000 times the size of the pattern; and curing the second surface to further form the base support structure, wherein the base support structure comprises a second plurality of lines, and wherein curing comprises using a second mask, wherein the second mask is within 10% of the size of the pattern.

In an embodiment, a reinforced flexoplate comprising: a floor comprising an elastomer or a photopolymer disposed on a polyethylene terephthalate film; a printing ink surface comprising a raised print pattern disposed on the photopolymer comprising a first plurality of lines, and wherein a base support structure comprising a second plurality of lines is disposed on the photopolymer. The embodiment further comprising wherein each line of the first plurality lines is disposed in an alternating fashion with each line of the second plurality of lines, wherein the first plurality of lines is formed during a first cure using a first mask disposed on the photopolymer, wherein the first mask 10-1000 times the size of the first plurality of lines, and wherein the second plurality of lines is formed using a second mask, wherein the second mask is within 10% of the size of the second plurality of lines.

BRIEF DESCRIPTION OF THE DRAWINGS

For a detailed description of exemplary embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Flexography is a form of a rotary web letterpress where relief plates are mounted on to a printing cylinder, for example, with double-sided adhesive. These relief plates, which may also be referred to as a master plate or a flexoplate, may be used in conjunction with fast drying, low viscosity solvent, and ink fed from anilox or other two roller inking system. The anilox roll may be a cylinder used to provide a measured amount of ink to a printing plate. The ink may be, for example, water-based or ultraviolet (UV)-curable inks. In one example, a first roller transfers ink from an ink pan or a metering system to a meter roller or anilox roll. The ink is metered to a uniform thickness when it is transferred from the anilox roller to a plate cylinder. When the substrate moves through the roll-to-roll handling system from the plate cylinder to the impression cylinder, the impression cylinder applies pressure to the plate cylinder which transfers the image on to the relief plate to the substrate. In some embodiments, there may be a fountain roller instead of the plate cylinder and a doctor blade may be used to improve the distribution of ink across the roller.

Flexographic plates may be made from, for example, plastic, rubber, or a photopolymer which may also be referred to as a UV-sensitive polymer. The plates may be made by laser engraving, photomechanical, thermo-mechanical, or photochemical methods. The preferred flexographic process may be set up as a stack type where one or more stacks of printing stations are arranged vertically on each side of the press frame and each stack has its own plate cylinder which prints using one type of ink and the setup may allow for printing on one or both sides of a substrate. In another embodiment, a central impression cylinder may be used which uses a single impression cylinder mounted in the press frame. As the substrate enters the press, it is in contact with the impression cylinder and the appropriate pattern is printed. Alternatively, an inline flexographic printing process may be utilized in which the printing stations are arranged in a horizontal line and are driven by a common line shaft. In this example, the printing stations may be coupled to curing stations, cutters, folders, or other post-printing processing equipment. Other configurations of the flexo-graphic process may be utilized as well.

In an embodiment, flexo plate sleeves may be used, for example, in an in-the-round (ITR) imaging process. In an ITR process, the photopolymer plate material is processed on a sleeve that will be loaded on to the press, in contrast with the method discussed above where a flat plate may be mounted to a printing cylinder, which may also be referred to as a conventional plate cylinder. The flexo-sleeve may be a continuous sleeve of a photopolymer with a laser ablation mask coating disposed on a surface. In another example, individual pieces of photopolymer may be mounted on a base sleeve with tape and then imaged and processed in the same manner as the sleeve with the laser ablation mask discussed above. Flexo-sleeves may be used in several ways, for example, as carrier rolls for imaged, flat, plates mounted on the surface of the carrier rolls, or as sleeve surfaces that have been directly engraved (in-the-round) with an image. In the example where a sleeve acts solely as a carrier role, printing plates with engraved images may be mounted to the sleeves, which are then installed into the print stations on cylinders. These pre-mounted plates may reduce changeover time since the sleeves can be stored with the plates already mounted to the sleeves. Sleeves are made from various materials, including thermoplastic composites, thermoset composites, and nickel, and may or may not be reinforced with fiber to resist cracking and splitting. Long-run, reusable sleeves that incorporate a foam or cushion base are used for very high-quality printing. In some embodiments, disposable "thin" sleeves, without foam or cushioning, may be used. Sleeves may also provide a continuous stretch of long lengths of film rolls that are stitch-line free. Flat flexoplates that are cut and mounted on the cylinder comprise and display a stitch-line where the two ends meet, which may limit the usable sizes of the printed pattern to within the stitch lines. The formation of the patterns on the flexoplates may affect the print quality of the patterns produced as well as the life cycle and durability of the flexoplates and the repeatability of the printing process. The formation of the patterns on the flexoplates may affect the print quality of the patterns produced as well as the life cycle and durability of the flexoplates and the repeatability of the printing process.

DESCRIPTION OF THE DRAWINGS

Figure 1:
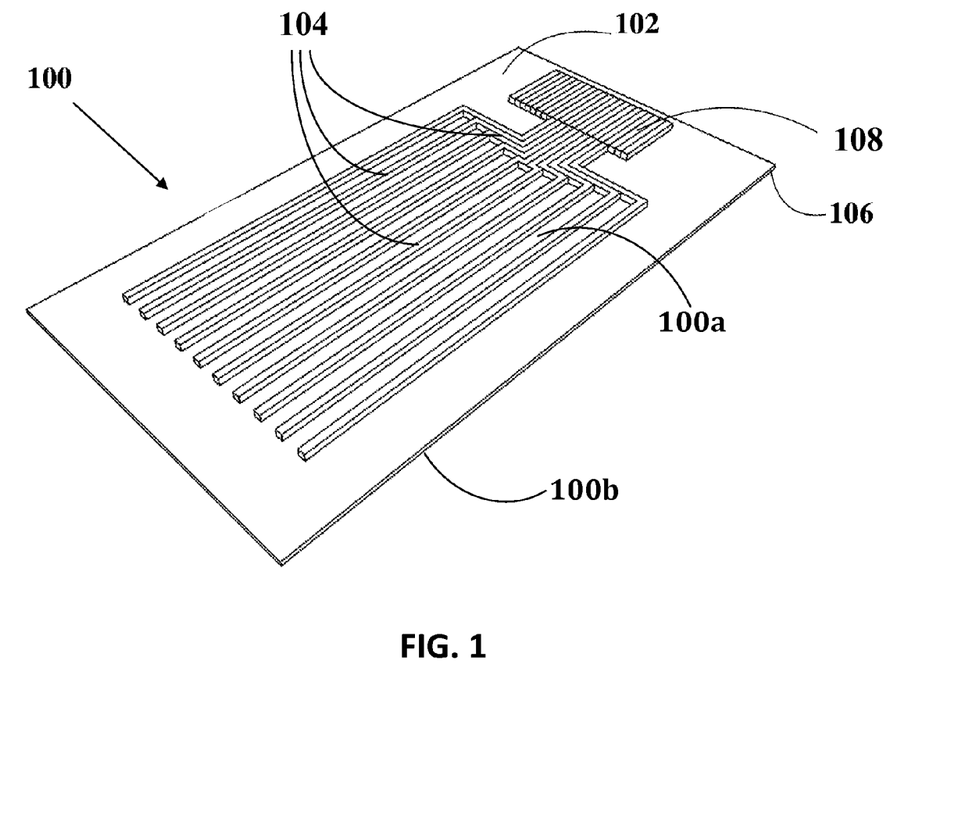
FIG. 1 is an illustration of an embodiment of an isometric view of a patterned flexoplate.

FIG. 1 is an illustration of an isometric view of a flexoplate. Flexoplate 100 comprises two sides, the first side 100a comprises a plurality of lines 108 which may be referred to as a pattern, an image, or a printable area. In an embodiment, the term "flexoplate" may refer to a backed photopolymer which may be referred to as a "flexoblank" that is patterned and used to apply ink to a substrate. In an embodiment, the flexoplate 100 comprises a floor 102 which is the polymer base that is the non-printable area of the plate, and a pattern 108 on backing 106 on second side 100b of flexoplate 100. The pattern 108 comprises a plurality of lines 104 that may have a width of 1-20 microns. The backing 106 is provided on the second side 100b of the flexoplate 100, opposite from the pattern 108. A curing process discussed below may be performed on both the front side of the flexoplate 100 where the pattern 108 is located and another curing process may be performed on the second side (backside) of the flexoplate 100 opposite where the pattern 108 is located 100a. The backside may be cured so that it does not embrittle during the manufacturing process, and so that it can be flush with the surface of the roller (not pictured) or the tape or other adhesive disposed on the roller's surface. In addition, curing the backside 100b of the flexoplate 100 affects the location of the floor on the first side 100a. The floor and the tip-to-width depth are dimensions of the first side 100a that are affected by the processing, for example, curing, of the backside. Floors and tip-to width depths are discussed below in FIG. 3. A patterned flexoblank, or flexoplate, may be used in a flexographic printing process as described with respect to FIG. 8 below.

Figure 2:
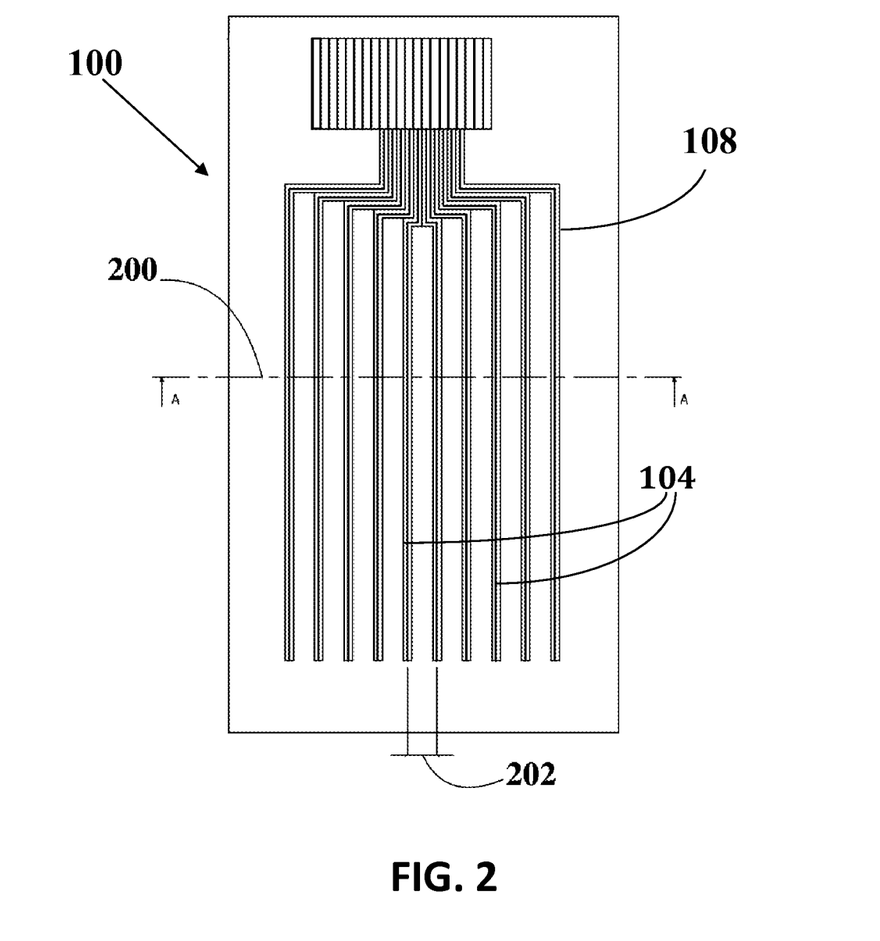
FIG. 2 is an illustration of an embodiment of a top view of a patterned flexoplate.

FIG. 2 is an illustration of a top view of flexoplate 100. As in FIG. 1, FIG. 2 shows the pattern 108 comprising a plurality of lines 104. Section A-A 200 represents the cross section illustrated in FIG. 3 and discussed below. In an embodiment, microscopic pattern 108 may be printed on a substrate (not pictured) which comprises spacing 202 between the each pair of adjacent lines of the plurality of lines 104.

Figure 3:
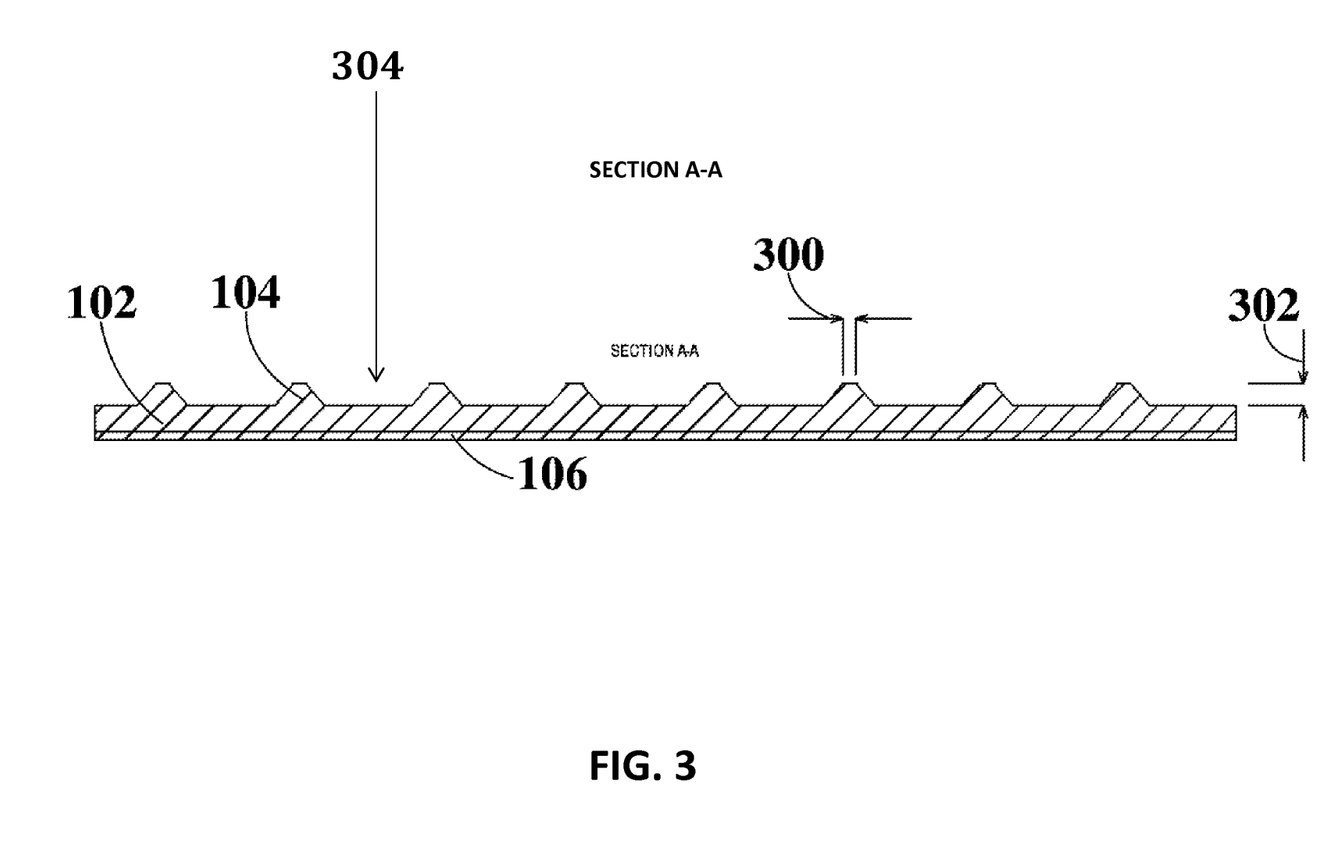
FIG. 3 is an illustration of an embodiment of a cross-sectional view of a patterned flexoplate.

FIG. 3 is an embodiment of a cross section of a flexoplate. Section A-A is formed by section line 200 on flexoplate 100. The flexoplate 100 may comprise backing 106, floor 102, and microscopic pattern 108 comprising a plurality of lines 104. The curing process may be dependent on the thickness of the floor 102. In an embodiment, the plurality of lines 104 has tip width 300 measured at the highest point of the plurality of lines 104 which should be uniform across the pattern and depth 302. In some embodiments, the closer the lines are together, the closer the resulting line width may be to the design value and the uniformity may be improved. This may be achieved by optimizing the curing process which may, as discussed below, comprise splitting the backside curing process into two steps.

The tip-to-floor depth 302, which may also be referred to as the relief depth, may refer to the distance between the tip of the pattern that is the printing surface of the flexoplate and the base of the flexoplate, which may be referred to as the floor 102, which is the photopolymer material cured from the backing layer of the flexoplate towards the printing surface. The term "tip width" 300 may refer to the width of highest point of a line of the plurality of lines 104. Feature 304 is the valley that comprises the tip-to-floor depth and that is located between each pair of lines formed by the curing process. In an embodiment, the cross section of each valley 304 is a trapezoid. In an alternate embodiment as in FIGS. 6A-6B the valley 304 may be a triangle, and in yet another example (not pictured) the valley may be a square, rectangle, or semi-circle. It is understood that, preferably, the plurality of lines are uniform in width and height. In an embodiment, curing may refer to the act of applying radiation to change at least one physical or chemical property of a material. In an embodiment, "backside curing" may refer to the curing of photomaterial on a flexoblank through the backing layer. The dosage used for curing the patterned first side 100a or the backside 100b may refer to the amount of energy per unit area applied in a radiation curing process. Dosage may equal the power of the radiation source multiplied by the exposure time divided by the exposed area. In an embodiment, a section of the resulting flexoplate is similar to the section in FIG. 3, having a depth 302 of 200 microns and a tip width 300 of 1 micron-30 microns.

FIGS. 4A-4E are illustrations of different phases of a method of manufacturing flexoplates. In an embodiment at FIG. 4A at pre-processing assembly station 400, there is an unpatterned flexoblank 402. At pre-processing assembly station 400, the flexoblank 402 may comprise a photopolymer 404, with a backing 406 on a first side, and an imaging mask 408 disposed on a second side, and may be, for example, Flexcel NX manufactured by Kodak. It is appreciated that a flexoplate may be manufactured by a curing process while that flexoplate is, for example, disposed on a flat surface during processing or disposed on a cylinder during processing, an embodiment not pictured herein.

Figure 4A:
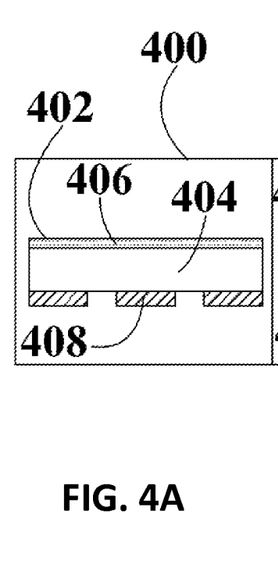
FIGS. 4A-E is an illustration of an embodiment of a flexoplate during the curing processes.
Figure 4B:
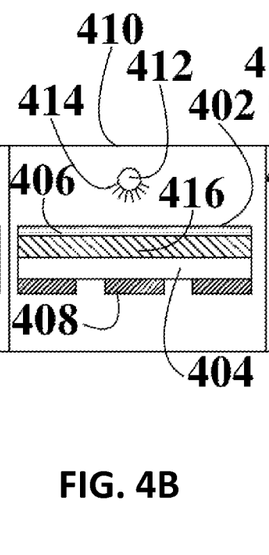

In FIG. 4B at curing station 410, radiation source 412 emits radiation 414. In an embodiment, the radiation 414 may comprise ultraviolet (UV) with wavelengths between 250 nm-600 nm. In one example, at curing station 410, a backside curing dosage of approximately 0.3 J/cm2 to 1.0 J/cm2 is applied to form a floor 416. The radiation 414 preferably penetrates backing 406 and cures a portion of photopolymer 404 which forms a floor 416. The floor thickness may play a role in the stability and life of the flexoplate during a flexographic printing process, and the curing parameters may be adjusted in order to obtain a specific floor thickness.

Figure 4C:
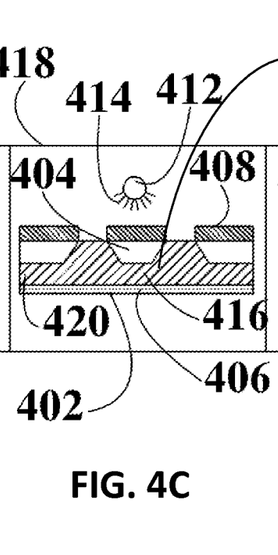

In FIG. 4C at radiation station 418, a radiation source 412 emits radiation 414, which penetrates the unmasked areas 408a but is unable to penetrate imaging mask 408. In one example, the flexoblank is exposed, on the side opposite to the side cured in FIG. 4B, with a dosage between 5 J/cm2 and 25 J/cm2. The exposed regions of photopolymer 404 are cured, forming relief 420, which may also be referred to as a cross-section of a patterned line from the plurality of pattern lines formed. In some embodiments, the raised pattern formed may be referred to as a relief, and in other embodiments it may be referred to simply as a pattern.

Figure 4D:
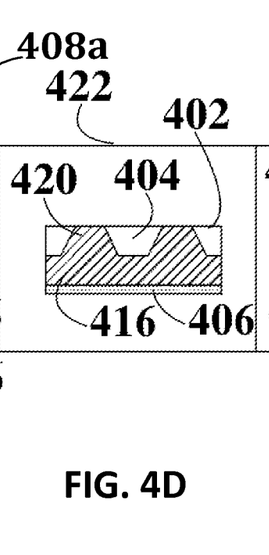

In FIG. 4D at mask removal station 422, the imaging mask 408 may be removed from flexoblank 402 to reveal the patterned lines represented by line 420. It is noted that the equipment at radiation stations 410 and 418 may be able to perform their respective operations simultaneously, for example in an in-line process, and that any of stations 400, 410, 418, 422, and 424 may be combined into a single or serial process. In the alternative, each station is offline and performed on its own.

Figure 4E:
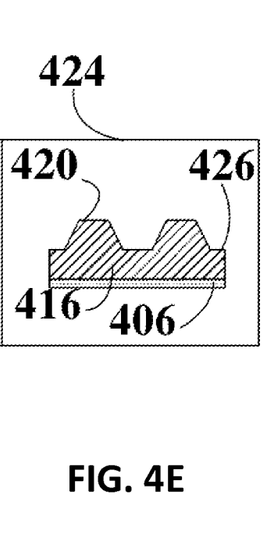

In FIG. 4E at finishing station 424, the photopolymer 404, which may also be referred to as a patterned flexoblank, may be removed from the curing process to form flexoplate 426. In an embodiment, the flexoplate formed may be flexoplate 100 in FIG. 1. In an embodiment, the structural integrity of a flexoplate or flexoblank may refer to a structure's ability to withstand deformation. In an embodiment, the curing process for the front side where the pattern is located may affect the aspect ratio, which may refer to the tip:depth ratio, and which may impact the structural integrity. In an alternate embodiment, the backside curing applied in FIG. 4B is varied so that the resulting flexoplates have depth 302 varying from 5 microns to 700 microns. In an embodiment a depth 302 of 40 microns-500 microns may be preferable for use in the flexographic printing process.

Figure 5A:
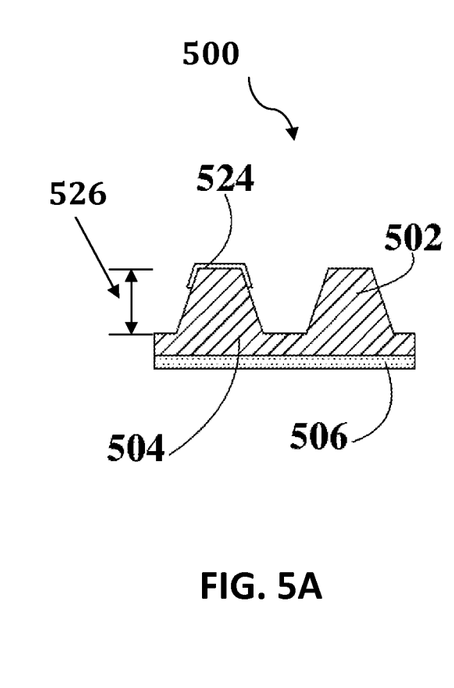
FIGS. 5A-5C are illustrations of various embodiments of cross-sections of patterned flexoplates with varying valley depths.
Figure 5B:
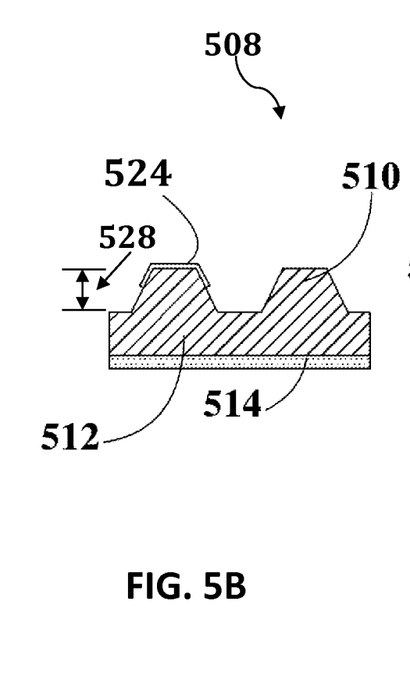
Figure 5C:
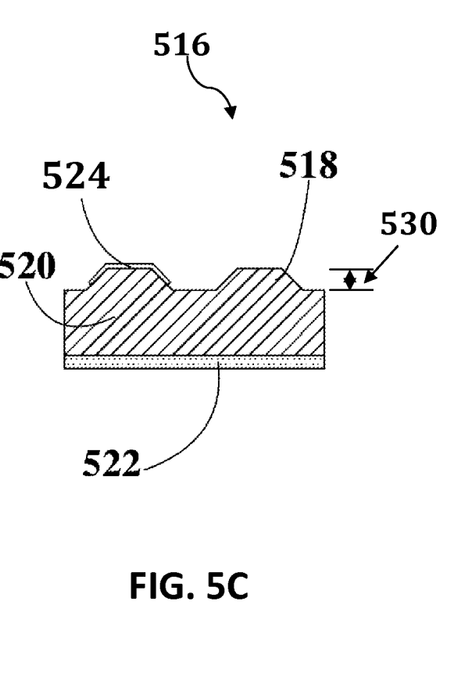

FIGS. 5A-5C are illustrations of flexoplate cross sections with varying valley depths. FIG. 5A illustrates a cross-section of a flexoplate 500 with a tip-to-floor depth 526 that may also be referred to as the valley depth with a pattern line 502 on the floor 504 that is disposed on top of the backing 506. When the flexoplate is used in production, ink 524 is transferred to the flexoplate so that it can be transferred from the pattern line 502, which represents a plurality of pattern lines as shown in FIGS. 1 and 2, to a substrate. During processing, the ink 524 flows through the channels (not pictured) created by the tip-to-floor depth 526 as to not impede the printing of the pattern represented by pattern line 502. FIG. 5B shows a cross-section of flexoplate 508 with pattern line 510 on floor 512 and backing 514. Flexoplate Section 516 with pattern line 518 on floor 520 and backing 522 is illustrated in FIG. 5C. In FIGS. 5A-5C the geometry of the cross section of the pattern line 502 of the plurality of lines that comprise a pattern (not shown) is a trapezoid. In another embodiment, the cross-sectional geometries of the line may comprise at least one of a semi-circle, rectangle, square, triangle, wave, or other known geometries. It should be appreciated that the cross-section of the flexoplate 500 has a greater tip-to-floor depth 526 than that of the cross-section of the flexoplate 508 in FIG. 5B with a flexoplate tip-to-floor depth 528 and that of the cross-section of a flexoplate 516 in FIG. 5C with a tip-to-floor depth 530. In some embodiments, for example, embodiments with similar cross-sectional geometries and varying depths, a large tip to floor depth may indicate a lower structural integrity in comparison to shallower depths. In FIG. 5C the flexoplate section 500 with the tip-to-floor depth 530 may experience an accumulation of ink 524 in the valleys between the individual features of pattern line 518. The minimum depth may depend on the spacing between the features. For example in the gap between 2 lines, as shown in graph 1, the minimum depth may depend on the print impression and a control or optimization of the impression setting may be performed by experimentation. This experimentation may be repeated for individual printed patterns or by families or groups of patterns that have common or scaled features. This may be because the depth of the reliefs 518 are such that compressing the flexoplate on a flat surface when the valley is not deep enough may cause the ink to settle down in the valley and smear during the printing process, so a relief depth that is deep enough to allow the flow of ink without buildup is preferable.

Figure 6A:
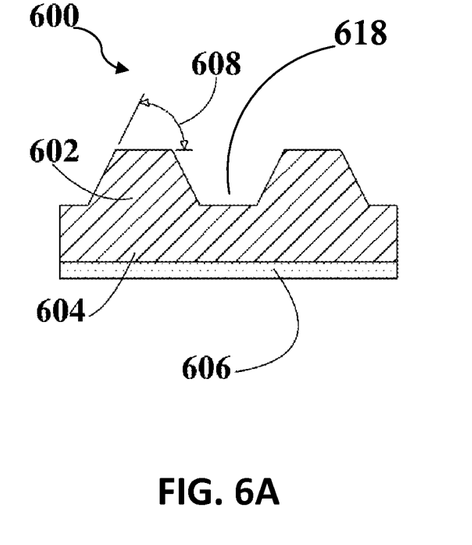
FIGS. 6A-6B are illustrations of cross-sections of flexoplates with varied exposure conditions.
Figure 6B:
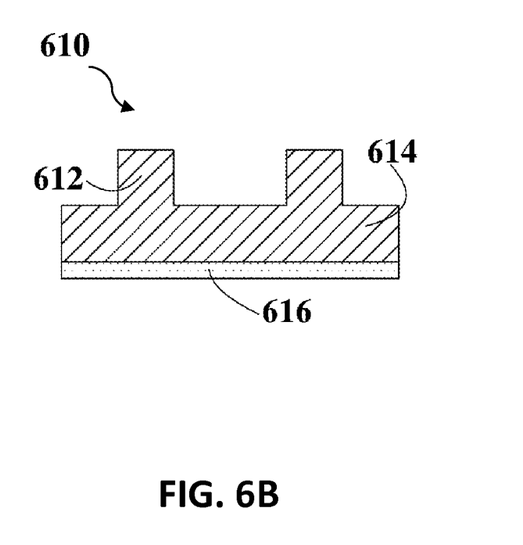

FIGS. 6A and 6B are embodiments of flexoplate cross-sections 600 and 610, respectively. The flexoplate cross-section 600 in FIG. 6A may comprise line 602 on floor 604 and backing 606. FIG. 6A further comprises a sidewall angle 608. The cross-section of the line 602 feature in FIG. 6A is trapezoidal in nature. FIG. 6A and cross-section 600 are shown in contrast with FIG. 6B and cross-section 610, where the flexoplate may comprise line 612, which may also be referred to as a pattern line on floor 614 and backing 616 and line 612 may be square or rectangular in nature. In FIG. 6A, sidewall angle 608 varies with the material used as the photopolymer. In some embodiments, as sidewall angle 608 increases, the structural integrity of line 602 increases and hence the more uniform the resulting high resolution patterns (HRP). An HRP may be any conductive or non-conductive material patterned on a substrate where the conductive material is less than 50 μm wide along the printing plane of the substrate. The flexoplate may be coupled to a printing roller using tape, spray adhesive, powder adhesive, or a sticky back of the flexoplate. During the printing process, pressure is created between the substrate and the geometry of the plate. This pressure may act to compress the flexoplate. If the plate has been properly formed, there will be ink flow (as opposed to clumping or smearing) through the valleys and, preferably, uniformity of the printed pattern because compression on the flexoplate during printing did not result in deformation that adversely affected the printed pattern. As such, a cross-sectional geometry such as a trapezoid may, in some embodiments, be preferred for printing fine lines less than 25 microns, or from 1-25 microns. In alternate embodiments, a square, triangular, or rectangular shape may be preferred.

In one example, if the tip-to-floor depth, or valley depth, 618 decreases, for example, as shown in FIGS. 5A-5C, there may be an undesirable accumulation of ink in the valleys represented by 618 between the individual features of the pattern represented by line 602. Additionally, as sidewall angle 608 approaches 90 degrees to more closely resemble FIG. 6B, the structural integrity of the relief may become insufficient for the manufacturing of HRPs. This is because the flexoplate is ultimately under compression during the printing process and the sidewall angles may provide more stability between 20 degrees and 70 degrees than at 90 degrees. Preferably, flexoblanks can be processed to form a sidewall angle of approximately 40 degrees, such as the one used in the Flexcel NX brand flexoblanks manufactured by Kodak, in order to be suitable for the printing of microscopic high resolution patterns. In other examples, other flexoblanks such as DuPont's Cyrel, Flint's Nyloflex, Esko's HD Flexo, MacDermid's LUX plate may be used. Line uniformity and uniform ink distribution may be insufficient under certain manufacturing conditions. Preferably, the line width is greater than 10 microns, while in some examples the printed lines are from 1-20 microns. In an alternate embodiment, materials resulting in sidewall angle 608 of 20 to 70 degrees may also be suitable for the printing of HRPs in some manufacturing conditions.

Figure 7A:
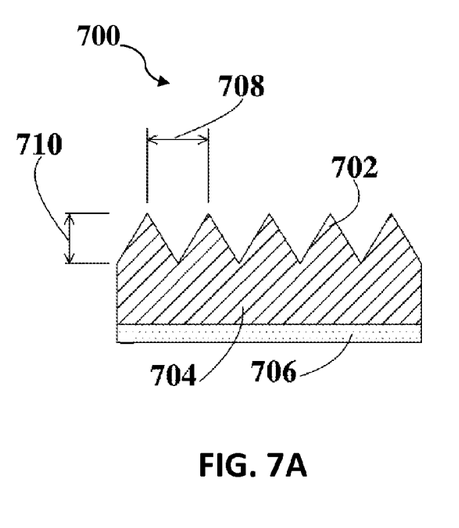
FIGS. 7A-7C are illustrations of embodiments of patterned flexoplates with triangular cross-sectional geometries.
Figure 7B:
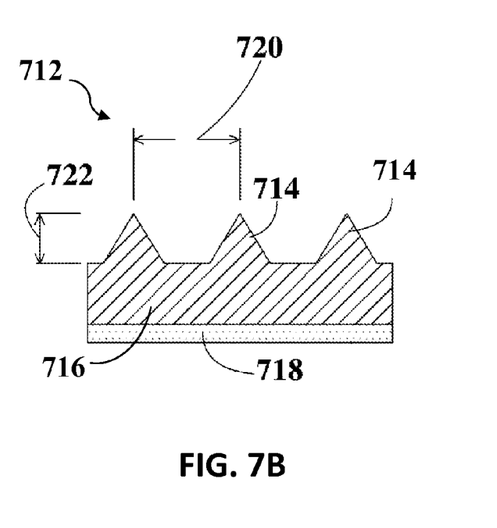
Figure 7C:
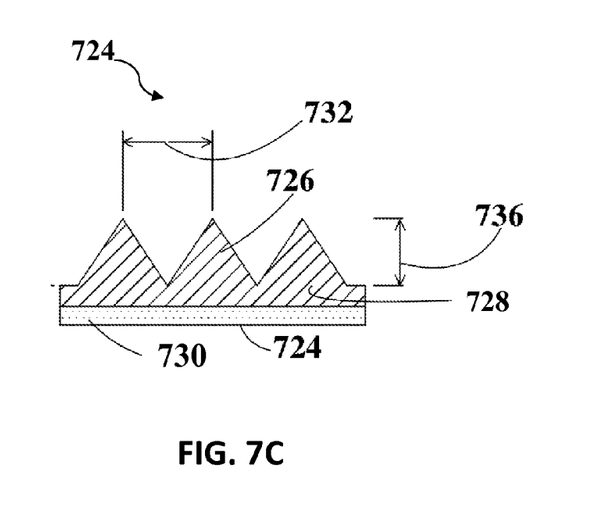

FIGS. 7A-7C are alternate embodiments of flexoplate cross-sections. As shown in FIG. 7A, a flexoplate section 700 may comprise a line 702 on a floor 704 and backing 706. As discussed above, line 702 is representative of the pattern formed, for example, as shown in FIGS. 1 and 2. Also shown is the spacing 708 between the lines 702 which is the spacing between the tips of the triangular cross-sections, also shown is valley depth 710. It is appreciated that the valley depth 710 as well as the other valleys disclosed herein may have a depth, width, pitch, and other geometric attributes. In an embodiment, the term "valley" may refer to the region between lines on a flexoplate. FIG. 7B shows a flexoplate section 712, with line 714 on a floor 716 and a backing 718; also shown are spacing 720 and valley 722. FIG. 7C shows a flexoplate section 724, with line 726 on floor 728 and backing 730, shows spacing 732, and tip to floor depth 736. The valley 722 in FIG. 7B has a different geometry, a trapezoidal geometry, than the triangular cross-sectional geometry shown in FIGS. 7A and 7C. As discussed above, the geometry of the pattern and the geometry valleys may be determined by the end application as well as the processing steps and raw materials, including the ink used, in order to print the desired pattern on a substrate.

Spacing 708, 722, and 732 in FIGS. 7A-7C between individual features of a pattern may be varied. During the forming process, the dosage applied backside curing at curing station 410 is varied in a portion of the flexoplates. The resulting flexoplates have sections similar to flexoplate sections 700, 712, and 724. Flexoplates with sections similar to flexoplate cross-section 700 have valley depth 710 that is equal to the tip to floor depth, though the valley has a distinct V shape due to spacing 708. Flexoplates with a section more similar to flexoplate cross-section 712 have spacing 720 that is larger than spacing 708 in flexoplates of similar size. In FIG. 7B, the valley 722 resembles a truncated "V" which may also be described as a trapezoid. Additionally, there may be flexoplates with sections which more closely resemble flexoplate section 724 in FIG. 7C. These flexoplates have spacing 732 which is less than spacing 708 in flexoplates of similar size. As a result, valley depth 710 is less than tip to floor depth 736.

Figure 8:
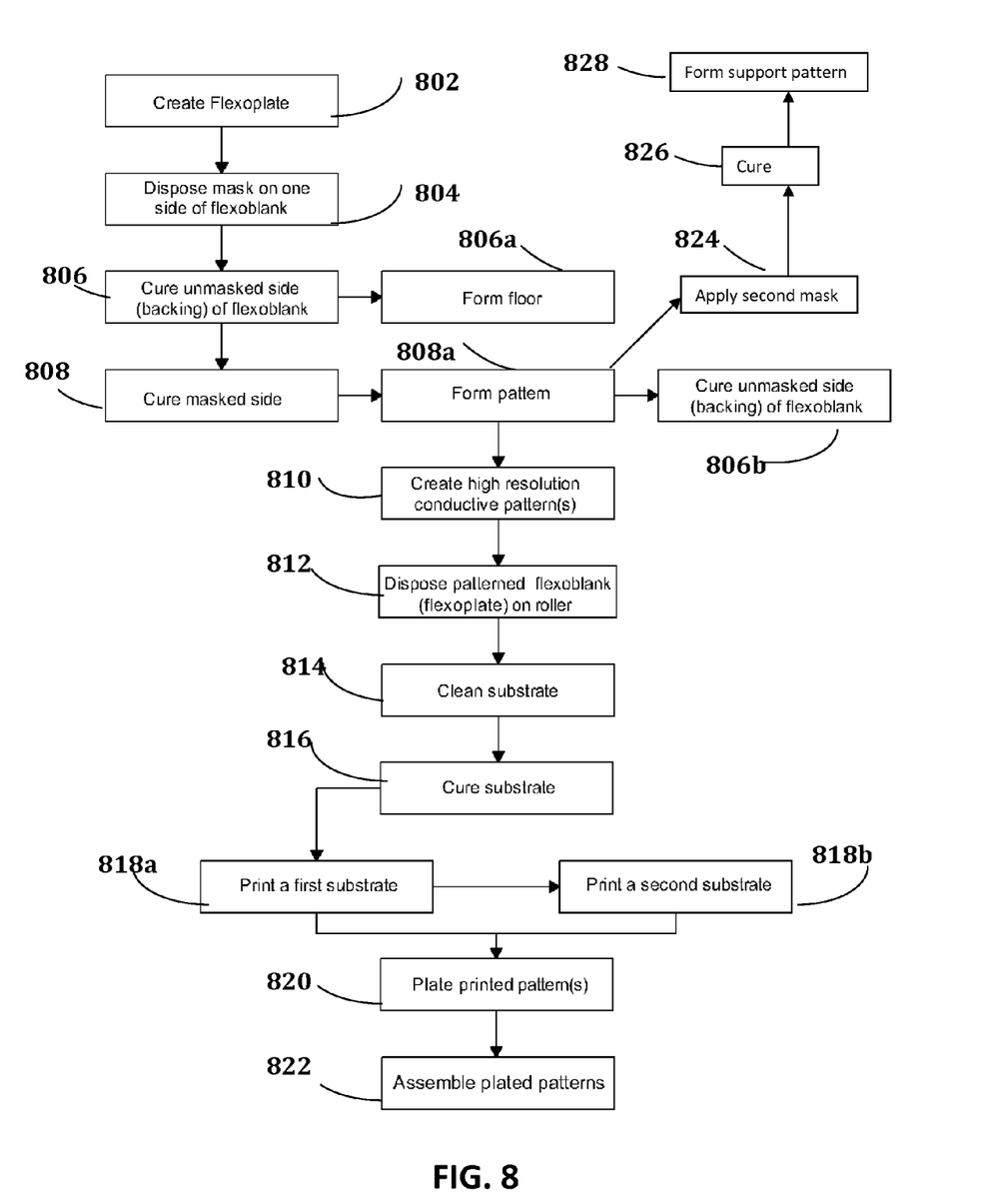
FIG. 8 is a flowchart of an embodiment of producing a high resolution conductive pattern by a flexographic printing process.

FIG. 8 is a flowchart of an embodiment of producing and assembling a high resolution conductive pattern by a flexographic printing process. The flexoplate is created by process 802 comprising disposing a mask on one side of a flexoblank at a masking station at step 804 wherein the mask is disposed on the side of the flexoblank that is to be patterned with a printing pattern. The mask disposed at the masking station at step 804 acts to block radiation from the curing process described below so that the features of the pattern, which may also be referred to as a plurality of lines, form in between the features of the mask. The mask disposed at the masking station at step 804 is disposed in the areas where the printing pattern is not to be formed. In some embodiments, for example, as described in FIGS. 9A-9B below, the mask disposed at the masking station at step 804 may be referred to as a first mask and may be from 10-1000 times the size of the printing pattern. At a first curing station at step 806, the other (unmasked) side of the flexoblank comprising the backing is cured. This curing may be by ultraviolet light, visible light, or thermal processing. Subsequent to the curing station at step 806, a floor is formed at step 806a on the side opposite the masking that just underwent the curing process. The masked side is cured at a second curing station at step 808 to form a cured pattern at step 808a. It is appreciated that the first and the second curing stations at step 806 and at step 808 may be used in series or in parallel. After the cured pattern is formed at step 808a, a high resolution conductive pattern may be created on a substrate at step 810. In some embodiments, the backside curing at the first curing station 806 may occur prior to the front side curing at second curing station at step 808, and in alternate examples, the front side curing at the second curing station at step 808 may occur prior to the back side curing at the first curing station 806. In another example, the backside cure at the first curing station at step 806 is followed by front side curing at the curing station at step 808 which is then followed by a subsequent (second) backside curing at step 808b. A second backside cure may be appropriate, for example, to strengthen the pattern, depending upon the intricacy of the pattern, which may be determined by the geometry and scale of the lines, and may also depend upon the desired stability of the patterned flexoplate used at a printing station at step 812. In an example, if two backside cures are used, the total time that would be needed for a backside cure may be split between a first and a second cure. In that example, the first backside cure would occur prior to the frontside cure, and the second backside cure would occur subsequent to the frontside cure.

The patterned flexoblank is disposed on a roller at the printing station at step 812. In some embodiments, the printing station at step 812 may comprise more than one roller and more than one flexoplate, and may also use different inks and ink sources (not pictured) for the various rolls. A substrate, such as a polymer, paper, or glass substrate, is cleaned at a cleaning station at step 814, which may comprise a plurality of cleaning processes including high energy ozone, a water wash, or a web cleaner. The substrate may be cured at a curing station at step 816, which may comprise more than one curing process. At a first printing station at step 818a, a first substrate is printed, and at a second printing station at step 818b, a second substrate is printed. In a first example, the first substrate is printed on a first side at the first printing station at step 818a, and a second substrate is printed on a first side at the second printing station at step 818b. In a second example, the first substrate is printed on a first side at the first printing station at step 818a, and then the second side of that substrate is printed at the second printing station at step 818b. In a third example, the first substrate is printed on a first side at the first printing station at step 818a, and a second pattern is printed on the same side of that substrate at the second printing station at step 818b adjacent to the pattern printed at the first printing station at step 818a. In any of these examples, the first and the second printing processes at the stations at step 818a and at step 818b may be carried out in series, wherein the method proceeds from the first printing station at step 818a to the plating at station at step 820, or from the first printing station at step 818a to the second printing station at step 818b to the plating station at step 820, or in parallel wherein both patterns are printed in the same printing step. It is also appreciated that the flexoplate and the ink used at the first printing station at step 818a may not be the same as those used at the second printing station at step 818b.

Subsequent to printing, the printed pattern(s) are plated at a plating station at step 820. In one embodiment, plating is electroless plating with a conductive material such as copper (Cu), nickel (Ni), gold (Au), silver (Ag), or palladium (Pd). The plating process forms the high resolution conductive patterns which may then be assembled. In some embodiments (not pictured) a plurality of spacers are flexographically printed on one or both printed patterns. The plated patterns may be assembled at the assembly station at step 822. The assembly process may depend on the printing configuration in that if one substrate has two patterns printed on it, that substrate may be bent or cut and then assembled so that the patterns are orthogonal to each other. If both of the patterns are printed on both sides of one substrate, the substrate may be trimmed or cut or otherwise finished. If the patterns are printed on two separate substrates, the substrates may be cut and trimmed and assembled with the first and the second patterns orthogonal to one another.

In an embodiment, as in FIGS. 9A and 9B below and referring in addition to FIG. 8, the front side may receive a second mask at a second masking station at step 824, wherein the second mask is within 10% of the printing pattern's dimensions and is disposed directly on the cured (printing) pattern formed at 808a. In this embodiment, the front side would undergo another curing at a curing station at step 826, wherein the second mask applied at a masking station at step 824 acts to shield the cured (printing) pattern formed at 808a, and a support structure comprising a plurality of lines is formed at step 828. The curing parameters used to form the support structure at step 828 may be similar to those discussed in FIG. 4C. The support structure may have a cross-sectional geometry of a square, rectangle, half-circle, trapezoid, triangle, or combinations thereof. Each line of the plurality of lines of the support structure may be disposed in an alternating fashion with each of the plurality of lines formed in the cured (printing) pattern at step 808a.

Figure 9A:
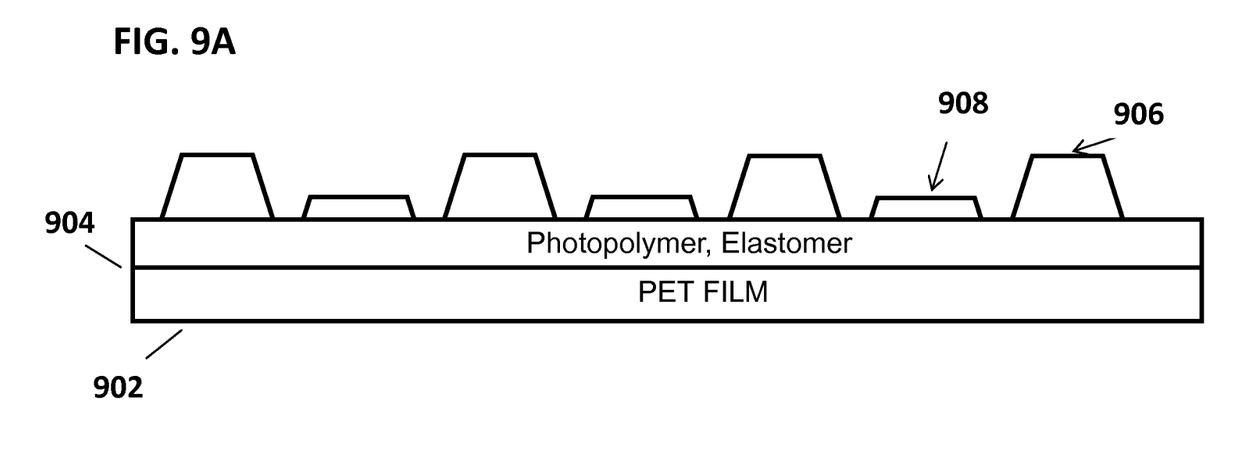
FIGS. 9A and 9B are illustrations of embodiments of cross-sectional geometries of a reinforced flexoplate printing pattern.
Figure 9B:
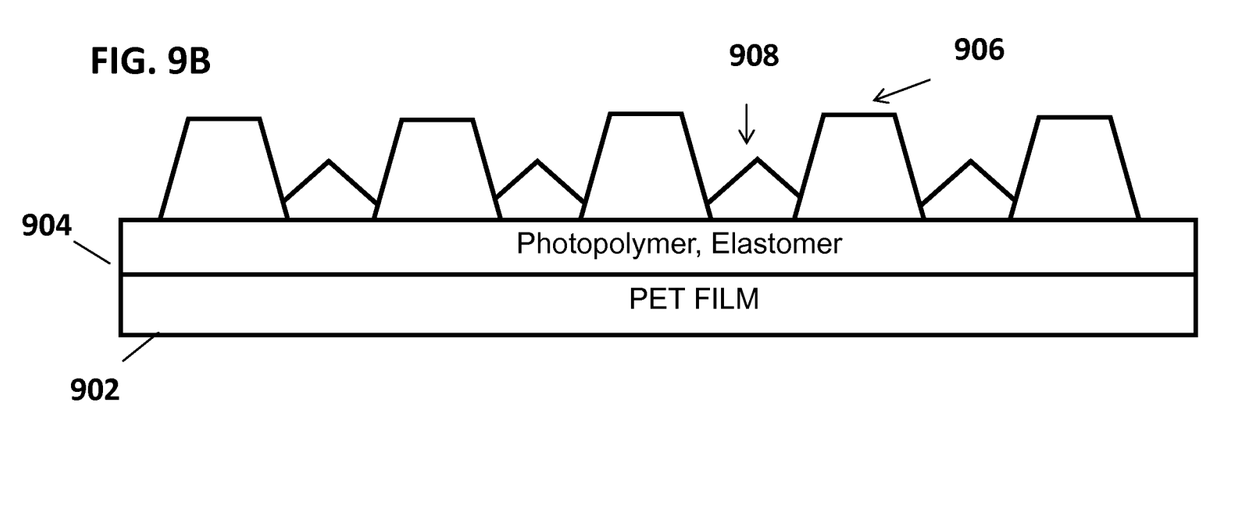

FIGS. 9A and 9B are illustrations of embodiments of cross-sectional geometries a reinforced flexoplate printing pattern. In FIG. 9A, a floor 904 comprising a photopolymer or elastomer is disposed on polyethylene terephthalate (PET) film 902. The floor 904 may have been formed, for example, as discussed in FIG. 8. A printing pattern 906 comprising a first plurality of lines to be used for printing a pattern on a substrate in a flexographic printing process is disposed on the floor 904. In FIG. 9A, the cross-sectional geometry of each of the lines of the first plurality of lines of the printing pattern 906 is a trapezoid. In alternate embodiments, each of the first plurality of lines in the printing pattern 906 has a cross-sectional geometry of a trapezoid, semi-circle, square, rectangle, triangle, or combinations thereof. Supporting pattern 908 comprises a second plurality of lines and may be formed as disclosed in FIG. 8, wherein the printing pattern 906 is formed using a mask that is 10-1000 times the size of the desired size of the pattern and wherein the mask is placed in the area that is not to be formed during curing as part of the printing pattern 906. A second mask within 10% of the size of the printing pattern may then be used as discussed above to form supporting pattern 908. In FIG. 9A, the cross-sectional geometry of each of the lines in the second plurality of lines 908 is a trapezoid. In alternate embodiments, each line of the second plurality of lines in the supporting pattern 908 has a cross-sectional geometry of a trapezoid, semi-circle, square, rectangle, triangle, or combinations thereof. In FIG. 9A, each of the lines of the first plurality of lines of the printing pattern 906 is disposed in an alternating fashion with each of the lines of the second plurality of lines of the supporting pattern 908. In this embodiment, the two pluralities of lines are not in contact with each other. In an alternate embodiment as in FIG. 9B, each line of the first plurality of lines of the printing pattern 906 is in contact with at least a portion of each line of the second plurality of lines of the supporting pattern 908. Also in FIG. 9B, the cross-sectional geometry of each line of the supporting pattern 908 is a five-sided structure with unequal sides that may be described as a pentagon. The supporting structure 908 in both FIGS. 9A and 9B may provide additional support for the printing pattern 906 when that pattern is under compression during the printing process.

The assembled substrates may comprise a touch sensor circuit that may be resistive or capacitive and may be ultimately assembled into a touch screen configuration for a television, tablet, phone, or other communication device that has a touch-screen display.

While the above description contains many specificities, these should not be construed as limitations on the scope of the invention, but as exemplifications of the presently preferred embodiments thereof. Many other ramifications and variations are possible within the teachings herein. For example, the methods for curing the flexoplates may be varied with the equipment used in the curing. Additionally, a number of different materials may be used as the photopolymer component of the flexoblanks, and the flexoblanks used may vary depending on the resolution required when printing patterns or may also vary according the other conditions inherent to the manufacturing process they may be used with, including the ink composition, contact pressure, ambient conditions, amongst others. Furthermore, the spacing utilized when patterning the flexoblanks may depend on numerous factors in addition to the required valley depth, and as such the performance of the flexoplates will also be tied to the factors. Note also that the above examples may be of great use in the printing of HRPs with patterns less than 10 microns wide.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for patterning a flexoblank to form a flexoplate comprising:
   curing a first surface of a flexoblank, wherein the first surface comprises a backing, wherein curing the first surface forms a floor on the first surface, and wherein curing comprises emitting ultraviolet (UV) radiation with a plurality of wavelengths between 250 nm-600 nm and a curing dosage from 0.3 J/cm$^2$ to 1.0 J/cm$^2$;
   disposing a mask on a second surface of a flexoblank, wherein the second surface is opposite the first surface;
   curing the second surface to form a pattern on the second surface, wherein curing the second surface comprise using UV light at a dosage between 5 J/cm$^2$ and 25 J/cm$^2$;
   wherein forming the pattern comprises forming a plurality of lines, wherein the cross-section of each of the plurality of lines is one of a square, a rectangle, a triangle, and a trapezoid, wherein a plurality of valleys are formed in between each set of lines of the plurality of lines, and wherein the valley depth is between 5-20 microns.

2. The method of claim 1, wherein each of the lines of the plurality of lines has a tip width, wherein the tip width is 1 micron-30 microns.

3. The method of claim 1, wherein the mask is removed from the second surface of the flexoblank, and wherein the pattern formed is formed between the areas covered by the mask.

4. A method for patterning a flexoblank to form a flexoplate comprising:
   curing a first surface of a flexoblank, wherein the first surface comprises a backing, wherein curing the first surface forms a floor on the first surface, and wherein curing comprises emitting ultraviolet (UV) radiation with a plurality of wavelengths between 250 nm-600 nm and a curing dosage from 0.3 J/cm$^2$ to 1.0 J/cm$^2$;
   disposing a mask on a second surface of a flexoblank, wherein the second surface is opposite the first surface;
   curing the second surface to form a pattern on the second surface using UV light at a dosage between 5 J/cm$^2$ and 25 J/cm$^2$; and
   wherein the pattern comprises a plurality of lines, and wherein a sidewall angle of the plurality of lines is between 20°-70°.

5. The method of claim 4, wherein the cross section of each of the plurality of lines is a triangle or a half circle.

6. The method of claim 4, wherein the cross section of each of the plurality of lines sidewall angle is a trapezoid comprising a tip, a first angled side, a second angled side opposite the first angled side, and a tip-to-floor depth.

7. The method of claim 4, wherein the sidewall angle is the angle formed between the tangent of the first angled side of the cross-section of each line of the plurality of lines and the top of the tip of each line of the plurality of lines.

8. The method of claim 7, wherein curing the first surface further comprises the plurality of wavelengths between 250 nm-360 nm.

9. The method of claim 4, wherein the sidewall angle is between 30°-50°.

10. The method of claim 4, wherein the plurality of wavelengths is between 250 nm-360 nm.

11. The method of claim 4, wherein a plurality of valleys are formed in between each line of the plurality of lines.

12. The method of claim 4, wherein curing the first surface is prior to curing the second surface.

13. The method of claim 4, wherein curing the first surface is subsequent to curing the second surface.

14. The method of claim 12, further comprising curing the first surface again subsequent to curing the second surface.

15. A method of forming a conductive pattern using a flexoplate comprising:
   patterning a flexoblank comprising a first and a second surface, to form a flexoplate wherein patterning comprises:
      disposing a mask on a second surface of the flexoblank;
      curing a first surface using ultraviolet light with a plurality of wavelengths between 250 nm-600 nm and a curing dosage between 0.3 J/cm$^2$ to 1.0 J/cm$^2$, wherein curing the first surface forms a floor on the first surface,
      curing the second surface using UV light at a dosage between 5 J/cm$^2$ and 25 J/cm$^2$;
      forming, subsequent to curing the second surface, a pattern on the second surface, wherein the pattern comprises a plurality of lines with sidewall angles between 20°-70°;
   disposing the patterned flexoblank on a roller;
   printing a first substrate using a first ink and the flexoplate on at least one side of the substrate;
   printing a second substrate on at least one side; and
   plating the first and the second substrates, with a conductive material to form the conductive pattern.

16. The method of claim 15, wherein curing the first surface further comprises using UV light with a plurality of wavelengths between 250 nm-360 nm.

17. The method of claim 15, wherein the cross-section of each of the plurality of lines is one of a square, a rectangle, a triangle, and a trapezoid.

18. The method of claim 15, wherein the plurality of printed lines are between 1 micron-20 microns wide.

19. The method of claim 15, wherein the sidewall angle is the angle formed between the tangent of the first angled side of the cross-section of each line of the plurality of lines and the top of the tip of each line of the plurality of lines.

20. The method of claim 15, wherein the sidewall angle is between 30°-50°.

21. The method of claim 15, wherein a plurality of valleys are formed in between each line of the plurality of lines, and wherein each valley of the plurality of valleys is between 5 microns-20 microns deep.

22. The method of claim 15, wherein a plurality of valleys are formed in between each line of the plurality of lines, and wherein each valley of the plurality of valleys is between 5 microns-700 microns deep.

23. The method of claim 15, wherein curing the first surface comprises a first and a second curing process, wherein the first curing process of the two curing processes for curing the first surface is performed prior to curing the second surface, and wherein the second curing process is performed subsequent to curing the second surface.

\* \* \* \* \*